(12) United States Patent
Wieczorek et al.

(10) Patent No.: US 6,806,153 B2
(45) Date of Patent: Oct. 19, 2004

(54) METHOD OF MANUFACTURING A FIELD EFFECT TRANSISTOR

(75) Inventors: Karsten Wieczorek, Dresden (DE); Manfred Horstmann, Dresden (DE); Thomas Feudel, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/462,893

(22) Filed: Jun. 17, 2003

(65) Prior Publication Data

US 2004/0121565 A1 Jun. 24, 2004

(30) Foreign Application Priority Data

Dec. 23, 2002 (DE) .......................... 102 60 613

(51) Int. Cl.$^7$ ........................................ H01L 21/336
(52) U.S. Cl. ...................... 438/301; 438/303; 438/306; 438/520; 438/522
(58) Field of Search ................................ 438/301, 303, 438/306, 307, 520, 522

(56) References Cited

U.S. PATENT DOCUMENTS

| | | | |
|---|---|---|---|
| 4,177,084 A | * 12/1979 | Lau et al. ........................ | 117/8 |
| 4,617,066 A | * 10/1986 | Vasudev ....................... | 438/515 |
| 5,885,886 A | 3/1999 | Lee ............................. | 438/528 |
| 6,004,871 A | * 12/1999 | Kittl et al. .................... | 438/592 |
| 6,362,063 B1 | 3/2002 | Maszara et al. ............ | 438/307 |
| 6,380,044 B1 | * 4/2002 | Talwar et al. ............... | 438/308 |

FOREIGN PATENT DOCUMENTS

| | | | | |
|---|---|---|---|---|
| DE | 40 35 842 A1 | 5/1992 | ......... | H01L/21/265 |
| EP | 0 201 585 B1 | 1/1990 | ......... | H01L/21/265 |
| JP | 03157941 A | 7/1991 | ......... | H01L/21/336 |

* cited by examiner

*Primary Examiner*—Hsien-Ming Lee
(74) *Attorney, Agent, or Firm*—Williams, Morgan & Amerson, P.C.

(57) ABSTRACT

The present invention allows the manufacturing of field effect transistors with reduced thermal budget. A first amorphized region and a second amorphized region are formed in a substrate adjacent to the gate electrode by implanting ions of a non-doping element, the presence of which does not significantly alter the conductive properties of the substrate. The formation of the amorphized regions may be performed before or after the formation of a source region, a drain region, an extended source region and an extended drain region. The substrate is annealed to achieve solid phase epitaxial regrowth of the amorphized regions and to activate dopants in the source region, the drain region, the extended source region and the extended drain region.

55 Claims, 2 Drawing Sheets

METHOD OF MANUFACTURING A FIELD EFFECT TRANSISTOR

BACKGROUND OF THE INVENTION

1. Field of the Invention

The present invention relates to the field of manufacturing of semiconductor devices, and, more particularly, to methods of manufacturing field effect transistors and methods for the formation of doped source and drain regions of field effect transistors.

2. Description of the Related Art

Integrated circuits comprise a large number of individual circuit elements, such as transistors, capacitors and resistors. These elements are internally connected to form complex circuits, such as memory devices, logic devices and microprocessors. Improving the performance of integrated circuits requires reducing feature sizes. Besides allowing for an increase in operating speed due to reduced signal propagation delays, the reduced feature size makes it possible to increase the number of functional elements of the circuit, thereby increasing its functionality. Reducing the size of circuit elements, in particular reducing the size of field effect transistors, requires improved methods of manufacturing them.

Figure 1:
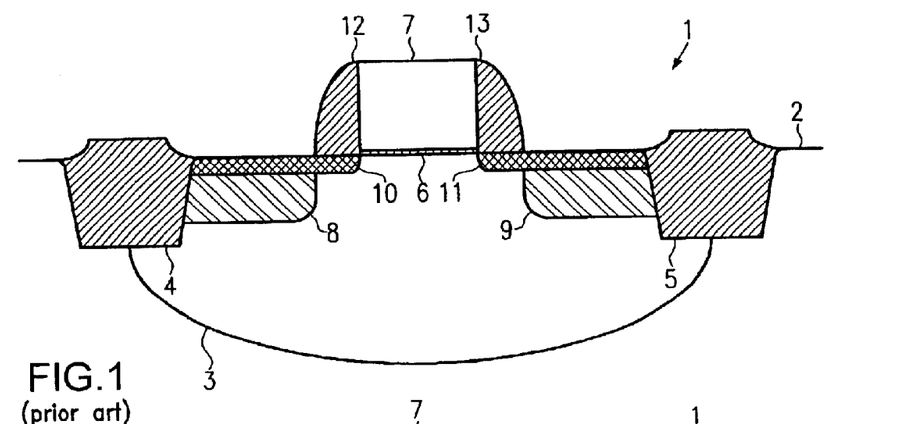
FIG. 1 shows a schematic cross-sectional view of a prior art field effect transistor.

A schematic cross-sectional view of a field effect transistor 1 is shown in FIG. 1. A substrate 2 comprises a doped active region 3. Shallow trench isolations 4, 5 isolate the active region 3 from neighboring circuit elements. An electrically conductive gate electrode 7 is formed over the substrate 2 and insulated from the substrate 2 by a gate insulation layer 6. The gate electrode 7 is flanked by sidewall spacers 12, 13. A source region 8 and a drain region 9 are adjacent to the sidewall spacers 12, 13. The field effect transistor 1 further comprises an extended source region 10 and an extended drain region 11 overlapping the source region 8 and the drain region 9. The extended source region 10 and the extended drain region 111 reach below the sidewall spacers 12, 13 and are adjacent to the gate electrode 7. The portion of the extended source region 10 which is not overlapped by the source region 8 is denoted as a source extension. Similarly, the portion of the extended drain region 11 which is not overlapped by the drain region 9 is denoted as a drain extension. The presence of the source/drain extensions allows better control of short channel effects.

A prior art process of manufacturing a field effect transistor is described with reference to FIG. 1. First, the trench isolations 4 and 5 and the active region 3 are formed within the substrate 2. Then, the gate insulation layer 6 and the gate electrode 7 are formed over the substrate 2 by well-known implantation sequences and deposition, photolithography and etch techniques, respectively. These formation processes are performed by means of advanced oxidation/deposition and photolithography techniques. Subsequently, the extended source region 10 and the extended drain region 11 are formed. This is done by implanting ions of a dopant material into the substrate 2. Portions of the substrate outside the transistor 1 which are not to be doped are photolithographically covered with a layer of photoresist which absorbs the ions. After implantation, the sidewall spacers 12, 13 are formed adjacent to the gate electrode 7 by deposition and anisotropic etch techniques. Then, the source region 8 and the drain region 9 are formed by ion implantation. The sidewall spacers 12, 13 protect the source extension and the drain extension from being irradiated with ions.

Ion implantation allows control of the distribution of dopants in the substrate. Dopant distribution can be controlled by varying the energy of the implant and/or the angle of incidence of the ions. The impact of energetic ions, however, leads to damage of the crystal lattice of the substrate. Ions lose energy through collision with substrate atoms. In these collisions, substrate atoms are pushed out of their positions in the crystal lattice, such that lattice defects, such as vacancies and interstitials, are created. Additionally, after ion implantation, the deposited dopants are not electrically active because they are sitting in interstitial sites instead of being incorporated into the crystal lattice of the substrate material.

Therefore, ion implantation is typically followed by annealing, which substantially repairs the substrate damages and activates the dopants. Frequently, this is done by rapid thermal annealing where the substrate is exposed to high temperature for a short time. Thus, source/drain regions with a low density of defects and dopant atoms sitting on sites in the crystal lattice of the substrate material are obtained.

Both the repair of lattice defects and the diffusion of dopant atoms in the substrate are thermally activated processes, the rate of which increases with temperature. Therefore, annealing also leads to an undesirable broadening of the distribution of dopant atoms in the substrate induced by dopant diffusion. If the substrate is exposed to temperature T for a time t, dopant atoms diffuse over a typical distance $$d = \sqrt{2D(T) \cdot t} \tag{1}$$

which is denoted as thermal budget. Here, $D(T)$ is the diffusion constant of dopant atoms at temperature T. Since the diffusion constant of dopant atoms increases with temperature, the thermal budget increases as the annealing temperature T and the duration t of the annealing process increase.

If the size of field effect transistors is reduced, the thermal budget which can be tolerated is reduced, since, in smaller structures, only dopant diffusion over a shorter distance can be tolerated. This, in turn, restricts the possibility to heal lattice damage induced by ion implantation.

In view of the above-mentioned problem, a need exists for methods of manufacturing a field effect transistor which allow the creation of doped regions with a low density of lattice defects at a reduced thermal budget.

SUMMARY OF THE INVENTION

The present invention is generally directed to methods of manufacturing a field effect transistor where regions in the substrate are amorphized by implanting ions of a non-doping element prior to an annealing process.

According to one illustrative embodiment of the present invention, a method of manufacturing a field effect transistor comprises forming amorphized regions in an active region in a substrate by implanting ions of a non-doping element and forming source and drain regions with a specified lateral and depth profile in the amorphized region. The method further comprises performing a solid phase epitaxial regrowth of the amorphized regions at a temperature substantially maintaining the specified lateral and depth profile.

According to another illustrative embodiment of the present invention, a method of manufacturing a field effect transistor comprises forming an active region in a substrate, forming a gate electrode over the substrate, wherein the gate electrode is electrically insulated from the substrate by a gate insulation layer, and forming a first amorphized region and a second amorphized region in the substrate adjacent to the gate electrode by implanting ions of a non-doping element. The method further comprises forming a doped extended source region in the first amorphized region and a doped extended drain region in the second amorphized region by implanting ions of a first dopant, forming a first dielectric sidewall spacer and a second dielectric sidewall spacer adjacent to the gate electrode, and forming a doped source region adjacent to the first sidewall spacer and a doped drain region adjacent to the second sidewall spacer by implanting ions of a second dopant. Finally, the method comprises annealing the substrate, which leads to solid phase epitaxial regrowth of the first and second amorphized regions, and to an activation of the first and second dopants.

According to another aspect of the present invention, a method of manufacturing a field effect transistor comprises forming an active region in a substrate, forming a gate electrode over the substrate, the gate electrode being electrically insulated from the substrate by a gate insulation layer, forming a doped extended source region and a doped extended drain region in the substrate adjacent to the gate electrode by implanting ions of a first dopant, and forming a first dielectric sidewall spacer and a second dielectric sidewall spacer adjacent to the gate electrode. The method further comprises forming a doped source region in the substrate adjacent to the first sidewall spacer and a doped drain region in the substrate adjacent to the second sidewall spacer by implanting ions of a second dopant and forming a first amorphized region comprising the extended source region and a second amorphized region comprising the extended drain region in the substrate by implanting ions of a non-doping element. Finally, the method comprises annealing the substrate, which leads to solid phase epitaxial regrowth of the first and second amorphized regions, and to an activation of the first and second dopants.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention allows the manufacturing of field effect transistors with reduced thermal budget. To this end, amorphized regions are formed in a substrate. The formation of the amorphized regions may be performed before or after the implantation of ions of a first and second dopant. The substrate is annealed to achieve solid phase epitaxial regrowth of the amorphized regions. Solid phase epitaxial regrowth leads to the formation of doped regions with a low density of lattice defects. The first and second dopants are incorporated into the crystal lattice of the substrate such that they are activated and act as electron donors or acceptors. Since solid phase epitaxial regrowth of an amorphized region can be performed at lower temperatures than the healing of lattice defects in a crystalline substrate, this process has a considerably lower thermal budget than the methods previously known in the art. Consequently, dopant diffusion and hence dopant profile "blurring" is reduced.

Figure 2:
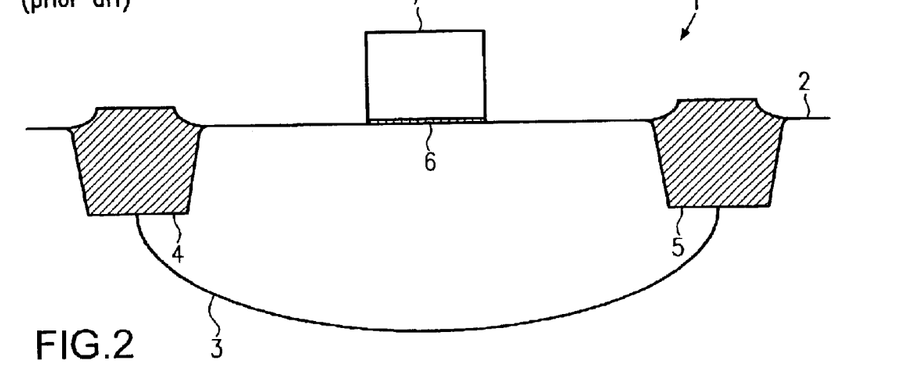
FIG. 2 is a schematic cross-sectional view of an illustrative field effect transistor in accordance with one embodiment of the present invention in an initial stage of the manufacturing process.

An embodiment of the present invention will now be described with reference to FIGS. 2–5. FIG. 2 shows a schematic cross-sectional view of a field effect transistor 1 in an initial stage of the manufacturing process. In a substrate 2, an active region 3, trench isolations 4, 5, a gate insulation layer 6, and a gate electrode 7 are formed. The formation of the field effect transistor as shown in FIG. 2 may be accomplished by well-known techniques.

Figure 3:
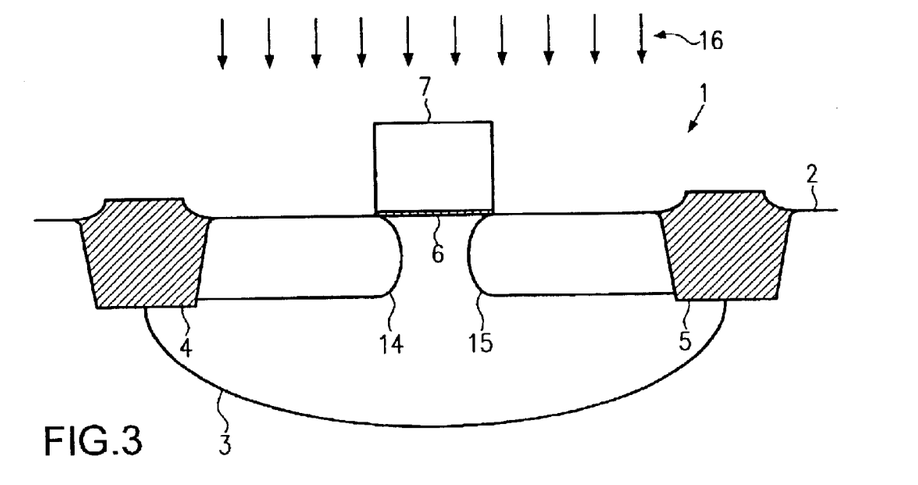
FIG. 3 is a depiction of the device of FIG. 2 wherein a non-doping element is introduced into the structure shown in FIG. 2.

Subsequently, the substrate 2 is irradiated with an ion beam 16 as shown in FIG. 3. The ion beam 16 comprises ions of a non-doping element which do not contribute to the number of charge carriers in the substrate material when they are incorporated into its crystal lattice. The non-doping element can be a noble gas, such as argon, xenon or krypton. Typical implant energies and doses for the above-identified non-doping elements are in the range of approximately 30–600 keV and approximately $5 \times 10^{14}$–$10^{17}$ ions/cm$^2$.

In other embodiments of the present invention, the non-doping element might be an element of the fourth group of the periodic table of elements, e.g., silicon or germanium, which is iso-electronic to a silicon substrate.

In the present invention, ion energy and ion flux of the ion beam 16 and the time of exposure of the substrate to the ion beam 16 are such that the long range order and mostly the short range order of the crystal lattice is lost and the material becomes amorphous. Due to the scattering of ions in the substrate, the amorphized regions 14, 15 may have a shape as shown in FIG. 3 and may be partially overlapped by the gate electrode 7.

In other embodiments of the present invention, ion beam 16 may impinge at an incline on substrate 2. The angle of incidence of ion beam 16 may be varied during ion implantation. The substrate may rotate during ion implantation.

Inclined incidence of the ion beam 16 may be used to control the depth of the amorphized regions 14, 15. The more the angle of incidence of the ion beam 16 deviates from a direction perpendicular to a surface of the substrate 2, the shallower the amorphized regions 14, 15 become if all other parameters of the ion beam 16 (e.g., the energy of the ions) are identical.

Inclined incidence of ion beam 16 on a rotating substrate 2 is particularly advantageous if a great overlap between the amorphized regions 14, 15 and the gate electrode 7 is desired. Since their momentum has a component parallel to the surface of the substrate, ions are stopped below the gate electrode, thereby amorphizing the substrate material. Rotation of the substrate ensures a desired degree of symmetry or asymmetry between amorphized regions 14 and 15. In addition to a variation of the angle of incidence of the ions, a variation of the energy of ions in ion beam 16 may be used to control the depth of the amorphized regions 14, 15. Ions with high kinetic energy create deeper amorphized regions than ions with low kinetic energy. In a preferred embodiment of the present invention, the depth of the amorphized regions 14, 15 is less than a height of the gate electrode 7 to avoid damage in the gate insulation layer 6.

Figure 4:
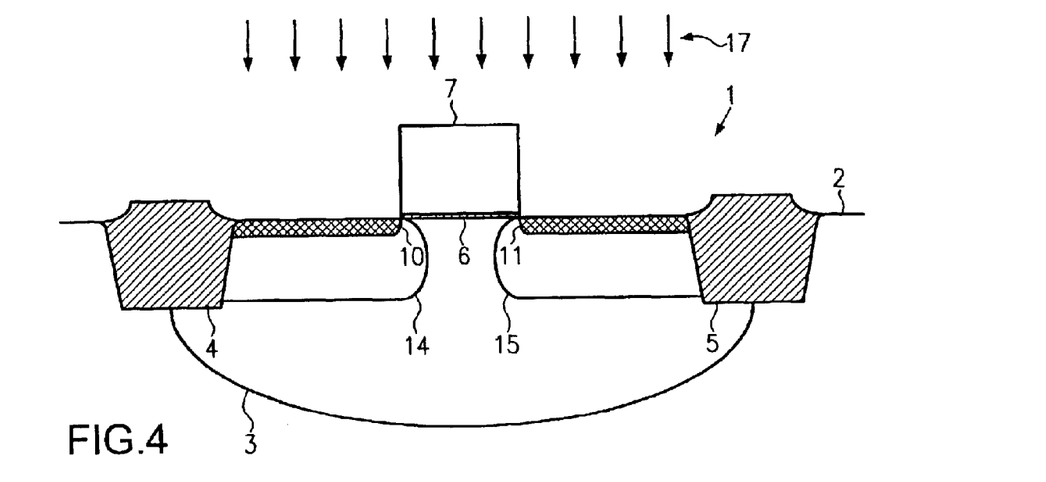
FIG. 4 depicts the device of FIG. 3 having a dopant material introduced into the substrate.

In FIG. 4, a schematic cross-sectional view of a field effect transistor in a later stage of manufacturing is shown. An extended source region 10 and an extended drain region 11 are formed in the substrate by implanting ions of a first dopant material. This is done by directing the ion beam 17 comprising ions of the first dopant material to the substrate 2. A concentration of the first dopant material can be controlled by varying the time of exposure of the substrate 2 to the ion beam 17.

The first dopant material can be any appropriate dopant material. Both n-type dopants, e.g., phosphorous, arsenic and antimony, and p-type dopants, e.g., boron and indium, may be used.

In other embodiments of the present invention, the ion beam 17 may impinge at an incline on the substrate 2. Additionally, the substrate 2 may rotate. The depth of the extended source region 10 and the extended drain region 11 may be controlled by varying the energy of ions in the ion beam 17 and the angle of incidence of the ion beam 17. Varying the angle of incidence of the ion beam 17 allows control of an overlap of the extended source region 10 and the gate electrode 7 and an overlap between the extended drain region 11 and the gate electrode 7.

Figure 5:
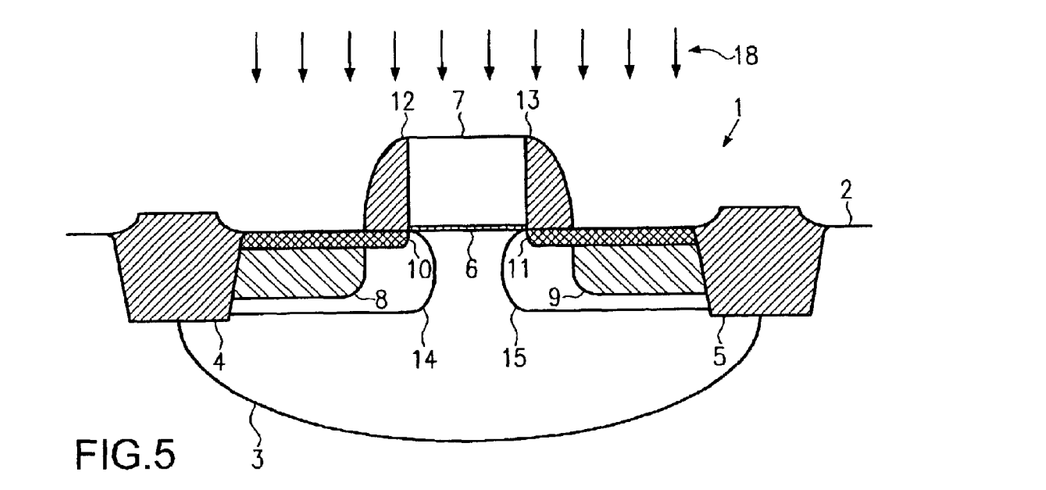
FIG. 5 is a depiction of the device of FIG. 4 after sidewall spacers and additional dopant material has been introduced into the substrate.

FIG. 5 shows a schematic cross-sectional view of the field effect transistor 1 in a later stage of the manufacturing process. After the formation of the extended source region 10 and the extended drain region 11, a first dielectric sidewall spacer 12 and a second dielectric sidewall spacer 13 are formed adjacent to the gate electrode 7. The formation of the sidewall spacers 12, 13 may be performed using advanced photolithography and etch techniques.

Subsequently, a source region 8 and a drain region 9 are formed. This is done by exposing the substrate 2 to an ion beam 18 comprising ions of a second dopant material, thus implanting the ions of the second dopant material into the substrate. The sidewall spacers 12, 13 absorb ions from the ion beam 18 such that the source region 8 and the drain region 9 are spaced apart from the gate electrode.

Similar to the first dopant material, the second dopant material may be any of the p-type and n-type dopants identified above. The first and second dopants can be identical. In other embodiments of the present invention, the first and second dopants may be different n-type dopants or different p-type dopants.

In further embodiments of the present invention, the ion beam 18 may impinge at an incline on the substrate 2 and the substrate 2 may rotate. The shape of the source region 10 and the drain region 11 may be controlled by varying an angle of incidence of the ion beam 18 and the energy of ions in the ion beam 18. Finally, the substrate 2 is annealed. This may be done in a furnace.

The substrate material in the amorphized regions 14 and 15 has a short-range order similar to that in a liquid. Contrary thereto, the substrate material outside the amorphized regions 14, 15 has a long-range ordered crystalline structure. The crystalline structure is energetically favorable in comparison to the amorphous structure. To perform the transition from the amorphous state to the crystalline state, an energy barrier must be overcome. This is possible at annealing temperatures. The amorphous material re-crystallizes starting at the boundaries between the amorphized regions 14, 15 and the crystalline substrate. Thus, over the course of time, the amorphized regions 14, 15 shrink and finally vanish. This process is denoted as a solid phase epitaxial regrowth.

Solid phase epitaxial regrowth is a comparatively slow process. Durations of one hour and longer may be required for shallow source and drain regions compared to only seconds in a conventional rapid thermal annealing process. During solid phase epitaxial regrowth, atoms of the first and second dopant, which were implanted into the extended source region 10 and the extended drain region 11, into the source region 8 and into the drain region 9, are incorporated into the crystal lattice of the substrate material such that they can act as electron donors or acceptors. This is denoted as activation of the dopants.

The energy barrier that must be overcome to re-crystallize an amorphous material without any long-range order is smaller than the energy barrier that must be overcome to heal damage in a long-range ordered crystal lattice. Therefore, in the present invention, annealing can be performed at a considerably lower temperature than in the prior art. The diffusion constant D(T) of dopant atoms in a substrate material increases exponentially with temperature. Therefore, according to equation (1), the thermal budget d also increases exponentially with temperature but only with the square root of the duration of annealing. Consequently, annealing at lower temperature can advantageously reduce the thermal budget even if much longer durations of the annealing process are required.

In one embodiment of the present invention, annealing is performed at a temperature in the range of approximately 500–700° C. This is in contrast to prior art methods wherein the anneal process performed to repair the damage to the silicon lattice and to activate the implanted end dopant material was typically performed at a temperature ranging from approximately 900–1100° C.

The maximum thermal budget which can be tolerated in the manufacturing process of a field effect transistor depends on the size of the transistor, in particular on the length of the gate electrode 7, the depth of the extended source region 10 and the extended drain region 11, and the overlap between the gate electrode 7 and the extended source region 10 and the extended drain region 11. The diffusion obtained by a specified thermal budget is adjusted to be smaller than the size of the corresponding structures.

In one embodiment of the present invention, the length of the gate electrode 7 is less than approximately 100 nm, and the depth of the source extension 10 and the depth of the drain extension 11 are less than approximately 20 nm.

Boundaries for temperature and duration of the annealing process may be calculated from the relation (1) between the diffusion constant of a dopant, the time of annealing t and the maximum tolerable thermal budget d. In particular, we have:

$$\sqrt{2D_{1(T)}t} \leq d$$

$$\sqrt{2D_{2(T)}t} \leq d$$

where $D_1(T)$ is the diffusion constant of the first dopant at annealing temperature T and $D_2(T)$ is the diffusion constant of the second dopant at annealing temperature T. Dopant diffusion constants $D_1(T)$ and $D_2(T)$ may be either determined experimentally, or may be calculated theoretically using quantum mechanical methods, such as density functional theory.

In one particular embodiment of the present invention, the depth of the amorphized regions 14, 15 is greater than the depth of the extended source/drain regions 10, 11 and the depth of the source/drain regions 8, 9. In this case, annealing leads to solid phase epitaxial regrowth of the source region 8 and the drain region 9, the extended source region 10, and the extended drain region 11, which yields a low density of defects in the crystal lattice in these regions.

In other embodiments of the present invention, the depth of the amorphized regions 14, 15 is greater than the depth of the extended source region 10 and the depth of the extended drain region 11, but smaller than the depth of the source region 8 and the depth of the drain region 9. This advantageously allows the reduction of ion flux and ion energy in the ion beam 16, yet also allows for solid phase epitaxial regrowth of the source/drain extensions, which are particularly sensitive to lattice defects.

With reference to FIG. 5, a further illustrative embodiment of the present invention is described. At an intermediate stage in manufacturing a field effect transistor 1 comprises a substrate 2, an active region 3, trench isolations 4, 5, a gate insulation layer 6, a gate electrode 7, sidewall spacers 12, 13, an extended source region 10, an extended drain region 11, a source region 8 and a drain region 9. The transistor 1 may be formed in accordance with well-established techniques described with reference to FIG. 1.

Then, an ion beam 18 is directed to the substrate 2. The ion beam 18 comprises ions of a non-doping element. The implantation of these ions into the substrate leads to the formation of a first amorphized region 14 and a second amorphized region 15. The first amorphized region 14 comprises the extended source region 10. The second amorphized region 15 comprises the extended drain region 11.

The first amorphized region 14 can also comprise the source region 8 and the drain region 9. The sidewall spacers 12, 13 may remain on the surface during the formation of the amorphized regions 14, 15. This is advantageous if the ion beam 18 impinges at an incline on the substrate 2, because then the sidewall spacers 12, 13 protect the gate insulation layer 6 from being damaged by irradiation with energetic ions. Finally, the substrate is annealed to achieve solid phase epitaxial regrowth of the amorphized regions 14, 15.

In other embodiments of the present invention, the sidewall spacers 12, 13 are removed before the formation of the amorphized regions 14, 15. In further embodiments of the present invention, the sidewall spacers 12, 13 remain on the substrate during the formation of amorphized regions comprising the source region 8 and the drain region 9. Since the sidewall spacers absorb ions from the ion beam 18, these amorphized regions are spaced apart from the gate electrode 7. Then, the sidewall spacers 12, 13 are removed. Subsequently, ions of a non-doping element are implanted to amorphize the substrate material in the extended source region 10 and in the extended drain region 11. Since the extended source region 10 and the extended drain region 11 are shallower than the source region 8 and the drain region 9, this implantation can be performed using lower ion energy and with a lower dose of ions than the formation of the amorphized regions comprising the source region 8 and the drain region 9. Advantageously, this helps avoid damaging the gate insulation layer 6 by irradiation with energetic ions, yet allows for a complete amorphization of the source region 8 and the drain region 9.

It should be noted that in the embodiments described above, a halo implant may additionally be carried out However, due to the well-defined dopant profile obtained by the amorphization and the "low-temperature" regrowth, the halo implant may be rendered obsolete, thereby at least partially compensating for the additional process time.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a field effect transistor comprising:

forming amorphized regions in an active region in a substrate by implanting ions of a non-doping element;

forming source and drain regions with a specified lateral and depth profile, wherein said amorphized regions are formed to a depth that is greater than a depth of said source and drain regions; and performing a solid phase epitaxial regrowth of said amorphized regions at temperature substantially maintaining said specified lateral and depth profile.

2. The method of claim 1, wherein said forming of said amorphized regions is performed before said forming of said source and drain regions.

3. The method of claim 1, wherein said forming of said amorphized regions is performed after said forming of said source and drain regions.

4. The method of claim 1, wherein said non-doping element is a noble gas.

5. The method of claim 1, wherein said non-doping element is one of argon, xenon and krypton.

6. The method of claim 1, wherein said solid phase epitaxial regrowth is performed at a temperature in the range of approximately 500–700° C.

7. The method of claim 1, wherein a duration of said solid phase epitaxial regrowth is greater than approximately one hour.

8. A method of manufacturing a field effect transistor comprising:

forming an active region in a substrate;

forming a gate electrode over said substrate, said gate electrode being electrically insulated from said substrate by a gate insulation layer;

forming a first amorphized region and a second amorphized region in said substrate adjacent to said gate electrode by implanting ions of a non-doping element;

forming a doped extended source region in said first amorphized region and a doped extended drain region in said second amorphized region by implanting ions of a first dopant, wherein said first and second amorphized regions are formed to a depth that is greater than a death of said source and drain regions;

forming a first dielectric sidewall spacer and a second dielectric sidewall pacer adjacent to said gate electrode;

forming a doped source region adjacent to said first sidewall spacer and a doped drain region adjacent to said second sidewall spacer by implanting ions of a second dopant; and annealing said substrate, said annealing leading to solid phase epitaxial regrowth of said first and second amorphized regions and to an activation of said first and second dopants.

9. The method of claim 8, wherein said first and second dopants are identical.

10. The method of claim 8, wherein said non-doping element is a noble gas.

11. The method of claim 8, wherein said non-doping element is one of argon, xenon and krypton.

12. The method of claim 8, wherein a square root of twice a product of a duration of said annealing and a diffusion constant of said first dopant at a temperature of said annealing is less than a predetermined thermal budget and a square root of twice a product of said duration and a diffusion constant of said second dopant at said temperature is less than said predetermined thermal budget.

13. The method of claim 8, wherein said annealing is performed at a temperature in the range of approximately 500–700° C.

14. The method of claim 8, wherein a duration of said annealing is greater than approximately one hour.

15. The method of claim 8, wherein a length of said gate electrode is less than approximately 100 mm.

16. The method of claim 8, wherein a depth of said extended source region and a depth of said extended drain region are less than approximately 20 nm.

17. The method of claim 8, further comprising controlling an overlap between said gate electrode and said extended source region and an overlap between said gate electrode and said extended drain region.

18. The method of claim 8, wherein said first amorphized region comprises said source region and said second amorphized region comprises said drain region.

19. A method of manufacturing a field effect transistor, comprising:

forming an active region in a substrate;

forming a gate electrode over said substrate, said gate electrode being electrically insulated from said substrate by a gate insulation layer;

forming a doped extended source region and a doped extended drain region in said substrate adjacent to said gate electrode by implanting ions of a first dopant;

forming a first dielectric sidewall spacer and a second dielectric sidewall spacer adjacent to said gate electrode;

forming a doped source region in said substrate adjacent to said first sidewall spacer and a doped drain region in said substrate adjacent to said second sidewall spacer by implanting ions of a second dopant;

forming a first amorphized region comprising said extended source region and a second amorphized region comprising said extended drain region in said substrate by implanting ions of a non-doping element, wherein said first and second amorphized regions are formed to a depth that is greater than a depth of said source and drain regions; and annealing said substrate, said annealing leading to solid phase epitaxial regrowth of said first and second amorphized regions, and to an activation of said first and second dopants.

20. The method of claim 19, wherein said first and second dopants are identical.

21. The method of claim 19, wherein said non-doping element is a noble gas.

22. The method of claim 19, wherein said non-doping element is one of argon, xenon and krypton.

23. The method of claim 19, wherein a square root of twice a product of a duration of said annealing and a diffusion constant of said first dopant at a temperature of said annealing is less than a predetermined thermal budget and a square root of twice a product of said duration and a diffusion constant of said second dopant at said temperature is less than a predetermined thermal budget.

24. The method of claim 19, wherein said annealing is performed at a temperature in the range of approximately 500–700° C.

25. The method of claim 19, wherein a duration of said annealing is greater than approximately one hour.

26. The method of claim 19, wherein a length of said gate electrode is less than approximately 100 nm.

27. The method of claim 19, wherein a depth of said extended source region and a depth of said extended drain region are less than approximately 20 nm.

28. The method of claim 19, further comprising controlling an overlap between said gate electrode and said extended source region and an overlap between said gate electrode and said extended drain region.

29. The method of claim 19, wherein said first amorphized region comprises said source region and said second amorphized region comprises said drain region.

30. The method of claim 19, further comprising:

forming a third amorphized region comprising said source region and a fourth amorphized region comprising said drain region in said substrate;

removing said first sidewall spacer and said second sidewall spacer;

wherein said formation of said third and fourth amorphized regions and said removing of said first and second sidewall spacers are performed before said formation of said first and second amorphized regions.

31. A method of manufacturing a field effect transistor comprised of source and drain regions having a dopant material positioned therein, the method comprising:

forming amorphized regions in an active region in a substrate by implanting ions of a non-doping element, wherein said amorphized regions are formed prior to performing any anneal process to activate said dopant material in said source and drain regions, and wherein said amorphized regions are formed to a depth that is greater than a depth of said source and drain regions;

forming said source and drain regions with a specified lateral and depth profile; and performing a solid phase epitaxial regrowth of said amorphized regions at a temperature substantially maintaining said specified lateral and depth profile.

32. The method of claim 31, wherein said forming of said amorphized regions is performed before said forming of said source and drain regions.

33. The method of claim 31, wherein said forming of said amorphized regions is performed after said forming of said source and drain regions.

34. The method of claim 31, wherein said non-doping element is a noble gas.

35. The method of claim 31, wherein said non-doping element is one of argon, xenon and krypton.

36. The method of claim 31, wherein said solid phase epitaxial regrowth is performed at a temperature in the range of approximately 500–700° C.

37. The method of claim 31, wherein a duration of said solid phase epitaxial regrowth is greater than approximately one hour.

38. A method of manufacturing a field effect transistor comprised of source and drain regions having a dopant material positioned therein, the method comprising:

forming an active region in a substrate;

forming a gate electrode over said substrate, said gate electrode being electrically insulated from said substrate by a gate insulation layer;

forming a first amorphized region and a second amorphized region in said substrate adjacent to said gate electrode by implanting ions of a non-doping element, wherein said first and second amorphized regions are formed prior to performing any anneal process to activate said dopant material in said source and drain regions, and wherein said first and second amorphized regions formed to a depth that is greater than a depth of said source and drain regions;

forming a doped extended source region in said first amorphized region and a doped extended drain region in said second amorphized region by implanting ions of a first dopant;

forming a first dielectric sidewall spacer and a second dielectric sidewall spacer adjacent to said gate electrode;

forming a doped source region adjacent to said first sidewall spacer and doped drain region adjacent to said second sidewall spacer by implanting ions of a second dopant; and annealing said substrate, said annealing leading to solid phase epitaxial regrowth of said first and second amorphized regions and to an activation of said first and second dopants.

39. The method of claim 38, wherein said first and second dopants are identical.

40. The method of claim 38, wherein said non-doping element is a noble gas.

41. The method of claim 38, wherein said first amorphized region comprises said source region and said second amorphized region comprises said drain region.

42. A method of manufacturing a field effect transistor comprised of source and drain regions having a dopant material positioned therein, the method comprising:

forming an active region in a substrate;

forming a gate electrode over said substrate, said gate electrode being electrically insulated from said substrate by a gate insulation layer;

forming a doped extended source region and a doped extended drain region in said substrate adjacent to said gate electrode by implanting ions of a first dopant;

forming a first dielectric sidewall spacer and a second dielectric sidewall spacer adjacent to said gate electrode;

forming a doped source region in said substrate adjacent to said first sidewall spacer and a doped drain region in said substrate adjacent to said second sidewall spacer by implanting ions of a second dopant;

forming a first amorphized region comprising said extended source region and a second amorphized region comprising said extended drain region in said substrate by implanting ions of a non-doping element, wherein said first and second amorphized regions are formed prior to performing any anneal process to activate said dopant material in said source and drain regions, and wherein said first and second amorphized regions are formed to a depth that is greater than a depth of said source and drain regions; and annealing said substrate, said annealing leading to solid phase epitaxial regrowth of said first and second amorphized regions, and to an activation of said first and second dopants.

43. The method of claim 42, wherein said first and second dopants are identical.

44. The method of claim 42, wherein said non-doping element is a noble gas.

45. The method of claim 42, wherein said non-doping element is one of argon, xenon and krypton.

46. The method of claim 42, wherein a square root of twice a product of a duration of said annealing and a diffusion constant of said first dopant at a temperature of said annealing is less than a predetermined thermal budget and square root of twice a product of said duration and a diffusion constant of said second dopant at said temperature is less than a predetermined thermal budget.

47. The method of claim 42, wherein said annealing is performed at a temperature in the range of approximately 500–700° C.

48. The method of claim 42, wherein a duration of said annealing is greater than approximately one hour.

49. The method of claim 42, wherein a length of said gate electrode is less than approximately 100 nm.

50. The method of claim 42, wherein a depth of said extended source region and a depth of said extended drain region are less than approximately 20 nm.

51. The method of claim 42, further comprising controlling an overlap between said gate electrode and said extended source region and an overlap between said gate electrode and said extended drain region.

52. The method of claim 42, wherein said first amorphized region comprises said source region and said second amorphized region comprises said drain region.

53. The method of claim 42, further comprising:

forming a third amorphized region comprising said source region and a fourth amorphized region comprising said drain region in said substrate;

removing said first sidewall spacer and said second sidewall spacer;

wherein said formation of said third and fourth amorphized regions and said removing of said first and second sidewall spacers are performed before said formation of said first and second amorphized regions.

54. A method of manufacturing a field effect transistor, comprising:

forming an active region in a substrate;

forming a gate electrode over said substrate, said gate electrode being electrically insulated from said substrate by a gate insulation layer;

forming a doped extended source region and a doped extended drain region in said substrate adjacent to said gate electrode by implanting ions of a first dopant;

forming a first dielectric sidewall spacer and a second dielectric sidewall pacer adjacent to said gate electrode;

forming a doped source region in said substrate adjacent to said first sidewall spacer and a doped drain region in said substrate adjacent to said second sidewall spacer by implanting ions of a second dopant;

forming a first amorphized region comprising said extended source region and a second amorphized region comprising said extended drain region in said substrate by implanting ions of a non-doping element, wherein said first and second amorphized regions are formed to a depth that is greater than a depth of said source and drain regions;

annealing said substrate, said annealing leading to solid phase epitaxial regrowth of said first and second amorphized regions, and to an activation of said first and second dopants;

forming a third amorphized region comprising said source region and a fourth amorphized region comprising said drain region in said substrate; and removing said first sidewall spacer and said second sidewall spacer;

wherein said formation of said third and fourth amorphized regions and said removing of said first and second sidewall spacers are performed before said formation of said first and second amorphized regions.

55. A method of manufacturing a field effect transistor comprised of source and drain regions having a dopant material positioned therein, the method comprising:

forming an active region in a substrate;

forming a gate electrode over said substrate, said gate electrode being electrically insulated from said substrate by a gate insulation layer;

forming a doped extended source region and a doped extended drain region in said substrate adjacent to said gate electrode by implanting ions of a first dopant;

forming a first dielectric sidewall spacer and a second dielectric sidewall spacer adjacent to said gate electrode;

forming a doped source region in said substrate adjacent to said first sidewall spacer and a doped drain region in said substrate adjacent to said second sidewall spacer by implanting ions of a second dopant;

forming a first amorphized region comprising said extended source region and a second amorphized region comprising said extended drain region in said substrate by implanting ions of a non-doping element, wherein said first and second amorphized regions are formed prior to performing any anneal process to activate said dopant material in said source and drain regions, and wherein said first and second amorphized regions are formed to a depth that is greater than a depth of said source and drain regions;

annealing said substrate, said annealing leading to solid phase epitaxial growth of said first and second amorphized regions, and to an activation of said first and second dopants;

forming a third amorphized region comprising said source region and a fourth amorphized region comprising said drain region in said substrate; and removing said first sidewall spacer and said second sidewall spacer, wherein said formation of said third and fourth amorphized regions and said removing of said first and second sidewall spacers are performed before said formation of said first and second amorphized regions.

* * * * *

UNITED STATES PATENT AND TRADEMARK OFFICE
CERTIFICATE OF CORRECTION

PATENT NO. : 6,806,153 B2
DATED : October 19, 2004
INVENTOR(S) : Karsten Wieczorek, Manfred Horstmann and Thomas Feudel It is certified that error appears in the above-identified patent and that said Letters Patent is hereby corrected as shown below:

Column 9,
Line 22, "death" should be -- depth --.
Line 25, "pacer" should be -- spacer --.
Line 54, "100 mm" should be -- 100 nm --.

Column 11,
Line 44, after "regions" insert -- are --.

Column 12,
Line 15, "pacer" should be -- spacer --.

Column 13,
Line 26, "epitaxial growth" should be -- epitaxial regrowth --.

Signed and Sealed this

Twenty-fifth Day of January, 2005

JON W. DUDAS
*Director of the United States Patent and Trademark Office*